United States Patent
Donovan et al.

(10) Patent No.: US 8,023,752 B1
(45) Date of Patent: Sep. 20, 2011

(54) DECOMPRESSION OF 16 BIT DATA USING PREDICTOR VALUES

(75) Inventors: Walter E. Donovan, Saratoga, CA (US); David K. McAllister, Holladay, UT (US)

(73) Assignee: NVIDIA Corporation, Santa Clara, CA (US)

( * ) Notice: Subject to any disclaimer, the term of this patent is extended or adjusted under 35 U.S.C. 154(b) by 1861 days.

(21) Appl. No.: 11/115,515

(22) Filed: Apr. 27, 2005

Related U.S. Application Data

(60) Provisional application No. 60/658,941, filed on Mar. 4, 2005.

(51) Int. Cl.
*G06K 9/36* (2006.01)
*G06K 9/46* (2006.01)

(52) U.S. Cl. .............................................. 382/233

(58) Field of Classification Search .......... 382/232, 382/233, 238, 251; 708/203
See application file for complete search history.

(56) References Cited

U.S. PATENT DOCUMENTS

| | | | |
|---|---|---|---|
| 4,802,222 A | 1/1989 | Weaver | |
| 5,699,460 A | 12/1997 | Kopet et al. | |
| 6,069,635 A | 5/2000 | Suzuoki et al. | |
| 6,240,431 B1 | 5/2001 | Dyer et al. | |
| 6,263,110 B1 | 7/2001 | Andrew et al. | |
| 6,292,194 B1 | 9/2001 | Powell, III | |
| 6,456,744 B1 | 9/2002 | Lafe | |
| 6,477,278 B1 | 11/2002 | Kondo | |
| 6,480,547 B1 | 11/2002 | Chen et al. | |
| 6,518,974 B2 | 2/2003 | Taylor et al. | |
| 6,751,587 B2 * | 6/2004 | Thyssen et al. | 704/228 |
| 6,819,793 B1 | 11/2004 | Reshetov et al. | |
| 6,842,219 B2 | 1/2005 | Lee et al. | |
| 6,959,110 B1 | 10/2005 | Danskin et al. | |
| 7,015,837 B1 | 3/2006 | Malvar | |
| 7,142,251 B2 | 11/2006 | Sha et al. | |
| 7,385,611 B1 | 6/2008 | Toksgiv et al. | |
| 7,711,938 B2 | 5/2010 | Wise et al. | |
| 2001/0017941 A1 | 8/2001 | Chaddha | |
| 2002/0184272 A1 | 12/2002 | Burges et al. | |

OTHER PUBLICATIONS

Office Action, U.S. Appl. No. 11/115,532, dated Sep. 8, 2010.
Office Action in U.S. Appl. No. 11/115,532 dated Feb. 16, 2011.

* cited by examiner

*Primary Examiner* — Phuoc Tran
(74) *Attorney, Agent, or Firm* — Patterson & Sheridan, LLP

(57) ABSTRACT

Systems and methods compress and decompress 16 bit data. The 16 bit data may be signed or unsigned and represented in a fixed point or floating point format. A fixed block size of data is compressed into a fixed length format. Data compressed using a medium quality compression scheme may be efficiently decompressed in hardware. Data may be efficiently compressed and decompressed in hardware using a high quality compression scheme. The high quality compression scheme has a lower compression ratio compared with the medium quality compression scheme, but is near lossless in terms of quality.

22 Claims, 18 Drawing Sheets

DECOMPRESSION OF 16 BIT DATA USING PREDICTOR VALUES

CROSS-REFERENCE TO RELATED APPLICATIONS

This application claims benefit of from commonly owned co-pending U.S. provisional patent application Ser. No. 60/658,941, titled "Compression and Decompression of 16 Bit Data," filed Mar. 4, 2005, having a common inventor and assignee as this application, which is herein incorporated by reference.

BACKGROUND OF THE INVENTION

1. Field of the Invention

Embodiments of the present invention generally relate to data compression and decompression and, more specifically, to fixed block compression and decompression of 16 bit data.

2. Description of the Related Art

Conventional compression techniques and formats, such as the DXTC compressed texture format used by DirectX 8, may be used to compress unsigned data including 3 channels represented by a 16 bit value, such as 565 format RGB data. These compression and decompression techniques and formats do not support 16 bit unsigned data, signed data, or data represented in a floating point format.

Accordingly, there is a need for data compression and decompression of 16 bit data that may be represented in a floating point format, in an unsigned fixed point format, or in a signed fixed point format.

SUMMARY OF THE INVENTION

The current invention involves new systems and methods for compressing and decompressing 16 bit data. The 16 bit data may be represented as in a floating point format or in a signed or unsigned fixed point format. A fixed size block including 16 bit data is compressed into a fixed length compressed format.

Various embodiments of a method of the invention for decompressing 16 bit values represented in a compressed format, include extracting control information from the compressed format, extracting quantized predictor values from the compressed format based on the control information, extracting a plurality of quantized error values from the compressed format, each quantized error value corresponding to a single uncompressed 16 bit value, unquantizing the quantized predictor values and the plurality of quantized error values to produce predictor values and error values, and reverse transforming the predictor values and error values to produce the 16 bit values.

Various embodiments of the invention include a system for decompressing 16 bit data represented in a compressed format, including an extraction unit, an unquantization unit, and a reverse transformation unit. The extraction unit is configured to extract quantized predictors and quantized errors from the compressed format. The unquantization unit is configured to unquantize the quantized predictors and quantized errors to produce predictors and errors. The reverse transformation unit is configured to compute one or more 16 bit values using the predictors and errors.

Various embodiments of a compressed data format of the invention representing sixteen 16 bit values, include control information in a first field, wherein the control information indicates a configuration of the compressed data format, a first predictor value in a second field, wherein the first predictor representing the mean of the sixteen 16 bit values, a second predictor value in a third field, a third predictor value in a fourth field, a fourth predictor value in a fifth field, and twelve error values in twelve additional fields, wherein each one of the twelve error values corresponds to one of the 16 bit values.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

The compression scheme may be used to compress 16 bit data that is signed or unsigned and represented in a fixed point or floating point format. A fixed block size of data is compressed into a fixed length format. When several blocks of data are compressed it is possible to determine the location of each particular block of data, permitting random access of the compressed data. Data compressed using a medium quality compression scheme may be efficiently decompressed in hardware. Data compressed using a high quality compression scheme may be efficiently compressed or decompressed in hardware. The high quality compression scheme has a lower compression ratio compared with the medium quality compression scheme, but is near lossless in terms of quality.

16 bit floating point format data is compressed to two's complement fixed point data by using its bit pattern directly as though it were a fixed point sign plus magnitude number. For example, if the 16 bit floating point format data is represented by a 1 bit sign, S, and a 15 bit exponent and mantissa, ME, then the conversion to the two's complement form, OUT is (using a C language statement):

OUT=S?-ME:ME.

OUT ranges in value from −32767 to 32767. This has the advantage of working in an approximate logarithmic domain, and mantissa bits are preserved for each exponent value. Furthermore, special numbers, e.g., not-a-number (NaN) and infinity (INF), may be handled by the compressor. Generally, when a special number is in a block, the compressor may either force all the values in the block to the special number or map the special number to the maximum value. Mapping the floating point format data to a 16 bit signed integer allows the same hardware to be used for floating point format data as well as signed or unsigned 16 bit integer data, for both the medium quality or high quality compression formats.

Figure 1A:
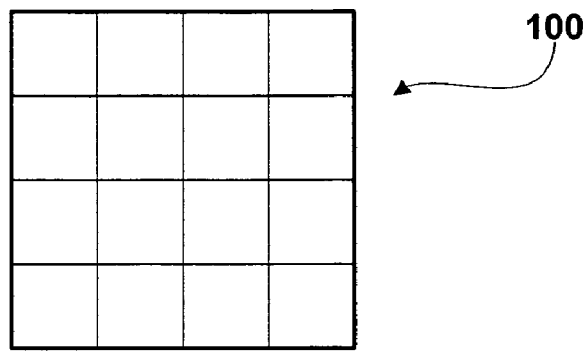
FIG. 1A illustrates a fixed size block of pixels in accordance with one or more aspects of the present invention.

FIG. 1A illustrates a fixed size block, block 100 that includes 16 pixels in accordance with one or more aspects of the present invention. Other embodiments of the present invention may include fewer or more pixels in an N×M dimension block, where N and M are each integers. Each pixel may include one or more channels of data, e.g., red, green, blue, alpha, depth, or the like. Each channel is compressed separately to reduce any cross-channel interactions. Blocks of compressed channels may then be interleaved when stored or stored separately. Unlike some conventional compression schemes, such as RGBE or FRGB, that are designed to compress 3 channels, any number of channels may be compressed using the present invention. In some embodiments of the present invention, a single texture may be limited to 1, 2, 3, or 4 channels and multiple textures are used to handle more than 4 channels.

A single channel of 16 bit pixel data for block 100 is 256 bits in size. When compressed using the medium quality compression scheme, a compressed channel of 16 bit pixel data for block 100 is 64 bits in size. Therefore, the compression ratio is 4:1. When two channels of 16 pixel data (512 bits) are compressed, the compressed pixel data for block 100 is 128 bits. The compression ratio of 4:1 is maintained, regardless of the number of channels that are compressed.

Figure 1B:
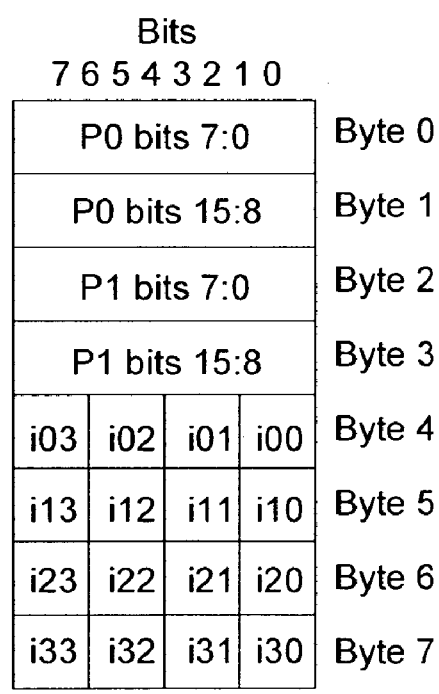
FIG. 1B illustrates data fields of a compression format representing a fixed size block of pixels in accordance with one or more aspects of the present invention.

FIG. 1B illustrates data fields of a compression format for the medium quality compression scheme representing a fixed size block of pixels in accordance with one or more aspects of the present invention. The compression format includes 64 bits of data (8 bytes) representing a compressed channel of block 100. The compression format includes two 16 bits values, P0 and P1, and 16 2 bit indices, one index for each pixel. Each index is referenced as iyx, where x and y correspond to the x,y position of the pixel within block 100. For example, index i01 corresponds to y=0 and x=1. This compression format is similar to the DXTC compressed texture format used by DirectX 8, however the DXTC compressed texture format does not represent floating point format or signed format data. Furthermore, DXTC compressed texture formats are used to compress 3 channels of data represented using a single unsigned 16 bit value, e.g., 565 RGB data. The present invention is used to compress a single channel of 16 bit data represented using floating point or fixed point (signed or unsigned) values.

When the data being compressed within block 100 is not a multiple of 4 wide or 4 high, the extra data is stored in the lower values of x and y in the iyx indices. For example, if the data is 3 wide (x) and 2 high (y), the indices i00, i01, i02, i10, i11, and i12 would be used and the other indices would be ignored. The other indices may each be set to any value.

Figure 2:
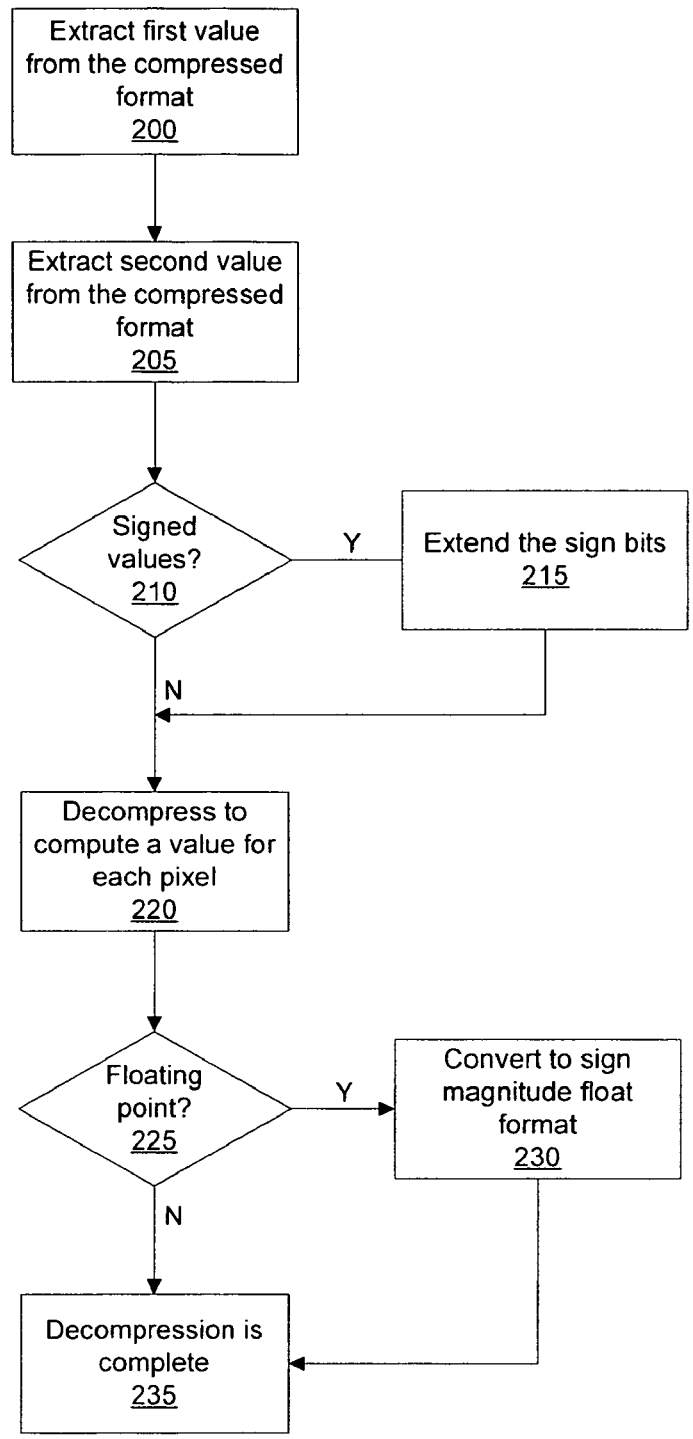
FIG. 2 illustrates a flow diagram of an exemplary method of decompressing data represented in the format shown in FIG. 1B in accordance with one or more aspects of the present invention.

FIG. 2 illustrates a flow diagram of an exemplary method of decompressing data represented in the medium quality compression format shown in FIG. 1B in accordance with one or more aspects of the present invention. In step 200 a first value, P0, is extracted from the medium quality compressed format. For example, the first value may be extracted from bytes 1 and 0. In step 205 a second value, P1, is extracted from the medium quality compressed format. For example, the second value may be extracted from bytes 3 and 2.

In step 210 the method determines if the compressed data is signed, and, if so, in step 215 the sign bits are extended. If, in step 210 the method determines that the compressed data is not signed, then the method proceeds directly to step 220. In step 220 the method decompresses the data represented in the format to produce a value for each pixel in the fixed size block, such as block 100.

In some embodiments of the present invention a function may be used to perform step 220. The code shown in Table 1 represents such a function, where p[0] is P0, p[1] is P1, indx is the index, in is an array of the 8 bytes of the medium quality compressed format, and out is an array of the 16 bit decompressed pixel values (signed fixed point, unsigned fixed point, or floating point). By way of illustration, the code is defined using C. However, any other language may be used to define the function.

TABLE 1

```
if ((p[0] & 0xFFFF) > (p[1] & 0xFFFF)) // unsigned compare
{
    p[2] = (2 * p[0] + p[1] + 1) / 3;
    p[3] = (p[0] + 2 * p[1] + 1) / 3;
```

TABLE 1-continued

```
    }
    else
    {
        p[2] = (p[0] + p[1] + 1) / 2;
        p[3] = 0;
    }
    for (int y = 0; y < 4; ++y)
    for (int x = 0; x < 4; ++x)
    {
        int t = y*4 + x;
        int indx = (in[y + 4] >> (2 * x)) & 3;
        out[t] = p[indx];
    }
}
```

The decompressed values produced by the function shown in Table 1 are signed or unsigned 16 bit values. In step 225 the method determines if the pixel values are represented in a floating point format, and, if so, in step 230 the decompressed pixel values are converted to the sign-magnitude 16 bit floating point format, where S is the sign bit and ME is the 15 bit mantissa and exponent. In some embodiments of the present invention a function may be used to convert the signed data to the floating point format in step 230. The code shown in Table 2 represents such a function, where IN is the 16 bit signed or unsigned value (out[t] of the function shown in Table 1). By way of illustration, the code is defined using C. However, any other language may be used to define the function.

TABLE 2

```
if (IN < 0) { S= 1; ME = MIN(-IN, 32767); }
else { S = 0; ME = IN; }
```

In step 235 the decompression is complete and the 16 bit pixel data for the block is restored. In other embodiments of the present invention, other functions, corresponding to the function used to compress the 16 bit values, may be used to perform step 220. Persons skilled in the art will appreciate that any system configured to perform the method steps of FIG. 2, or its equivalents, is within the scope of the present invention.

Figure 3A:
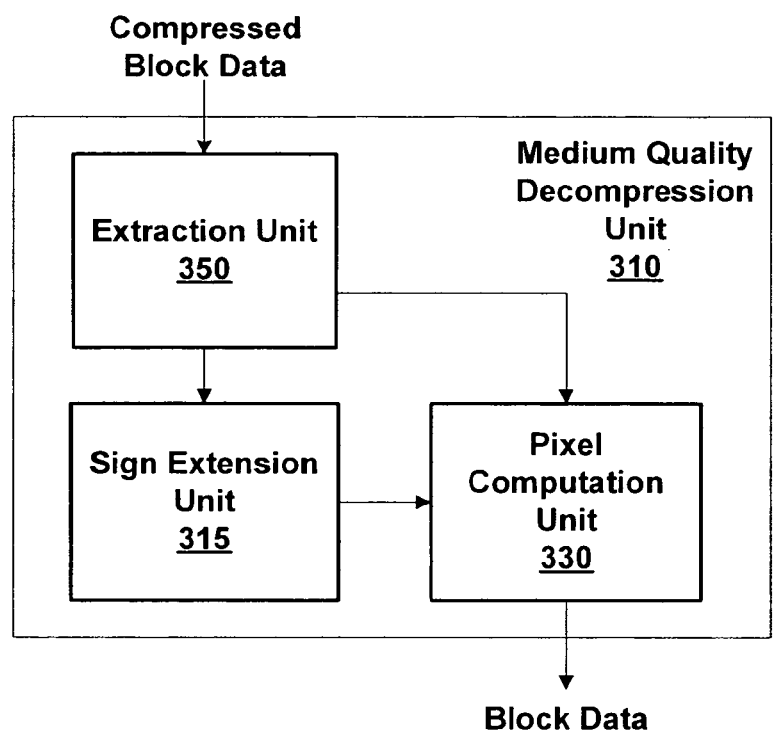
FIG. 3A is a block diagram of a decompression unit in accordance with one or more aspects of the present invention.

FIG. 3A is a block diagram of a medium quality decompression unit 310 in accordance with one or more aspects of the present invention. An extraction unit 350 within medium quality decompression unit 310 receives compressed block data and extracts the first and second values, e.g., P0 and P1, from the compressed block data. Extraction unit 350 outputs the first and second values to a sign extension unit 315. Sign extension unit 315 extends the sign bit of the first and second values when the compressed pixel data is signed. Sign extension unit 315 outputs the sign extended first and second values to a pixel computation unit 330. Extraction unit 350 outputs the 16 indices to pixel computation unit 330. Pixel computation unit 330 decompresses the compressed block data to produce the block data, specifically 16, 16 bit pixel values. The 16 bit pixel values may be represented in a floating point format or in a signed or unsigned fixed point format. Medium quality decompression unit 310 may be configured to decompress one or more channels of data for a single fixed size block of pixels.

Figure 3B:
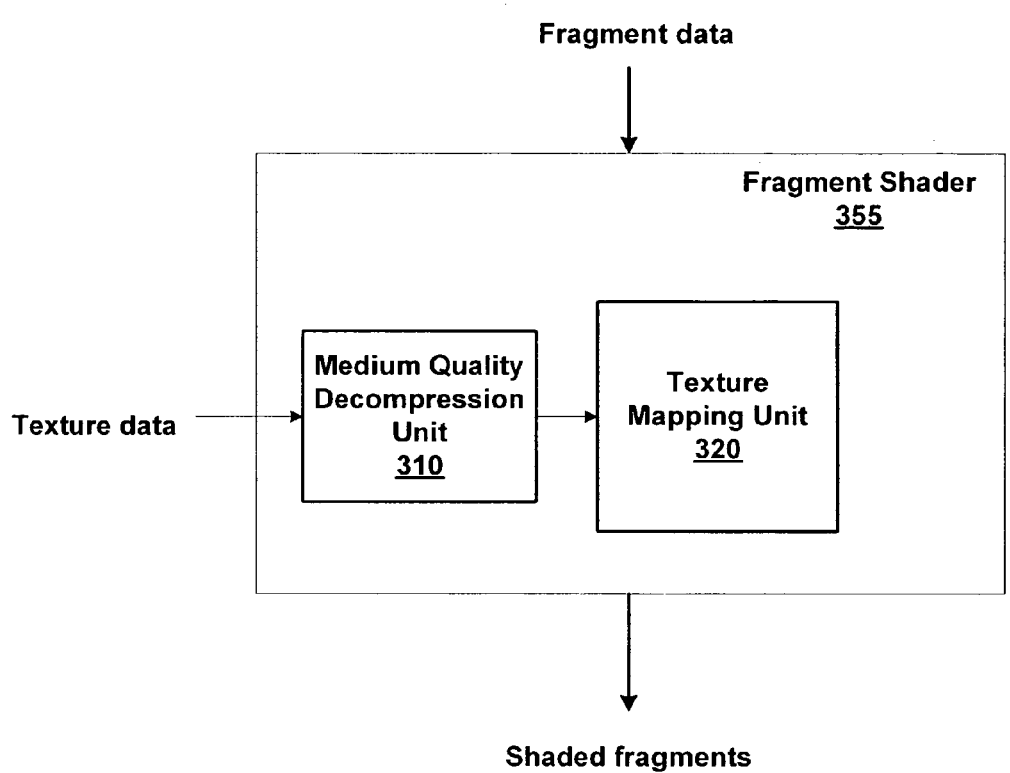
FIG. 3B is a block diagram of a portion of a graphics processor including the decompression unit shown in FIG. 3A in accordance with one or more aspects of the present invention.

FIG. 3B is a block diagram of a portion of a graphics processor including the decompression unit shown in FIG. 3A in accordance with one or more aspects of the present invention. In other embodiments of the present invention, medium quality decompression unit 310 may be included within a different type of data processor. A fragment shader 355 receives fragment data, including parameters associated with fragments (texture identifiers, texture coordinates, and the like). The texture identifiers may specify the compression scheme and whether or not the compressed data is signed or unsigned. Fragment shader 355 generates read requests for texture data that may stored as compressed data represented the medium quality compression format.

In some embodiments of the present invention, fragment shader 355 may include one or more cache memories configured to store texture data. A first cache memory may store compressed texture data and a second cache memory may store decompressed texture data. A first medium quality decompression unit 310 receives the compressed texture data and decompresses it to produce texture data including one or more channels. A texture mapping unit 320 receives the texture data directly from medium quality decompression unit 310 or indirectly from cache memory and processes the fragment data using the texture data to produce textured fragment data. Other processing units (not shown) may process the texture fragment data using techniques known to those skilled in the art to produce shaded fragments.

The medium quality compression scheme offers a 4:1 compression ratio with some data loss. One or more channels may be compressed or decompressed and the compressed data for a particular pixel may be easily located because a fixed block size is used. Furthermore, the medium quality compression scheme may be used to compress 16 bit data represented in a floating point format or in a signed or unsigned fixed point format.

A high quality compression scheme may be used when data loss should be minimized. The high quality compression scheme may be efficiently implemented in hardware for both compression and decompression of data. However, the compression ratio for the high quality compression scheme is lower than the compression ration for the medium quality compression scheme, specifically 2:1 compared with 4:1, respectively. The high quality compression scheme uses a bilinear predictor and a fixed-length encoding with adaptive quantization, as described further herein.

Figure 4:
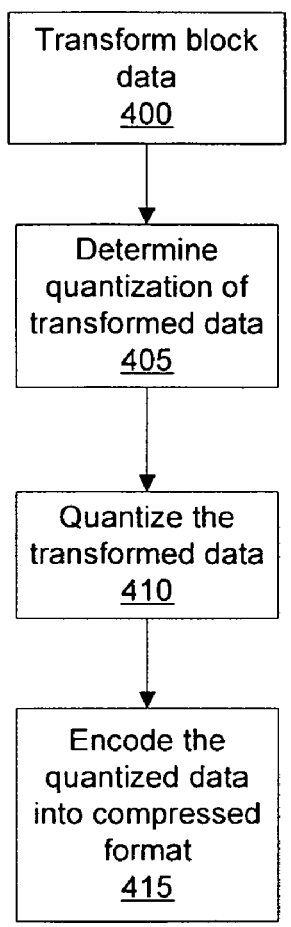
FIG. 4 illustrates a flow diagram of an exemplary method of compressing data within a fixed size block in accordance with one or more aspects of the present invention.

FIG. 4 illustrates a flow diagram of an exemplary method of compressing data within a fixed size block using the high quality compression scheme in accordance with one or more aspects of the present invention. In step 400 the a channel of pixel data for a block, such as block 100 is transformed, as described in conjunction with FIG. 6A, to produce transformed data. In step 405 the method determines quantization values, as described in conjunction with FIG. 6B, for application to the transformed data. In step 410 the transformed data is quantized, as described in conjunction with FIG. 6C, to produce quantized data. In step 415 the quantized data is encoded into the high quality compressed format, as described in conjunction with FIG. 6D.

Figure 5A:
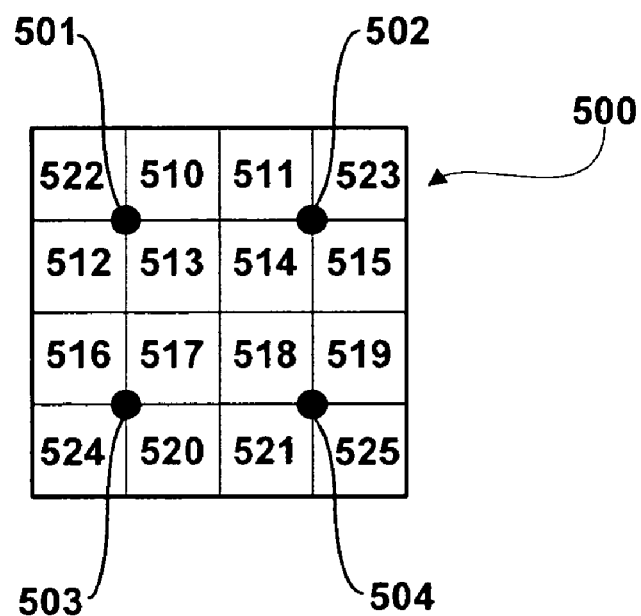
FIG. 5A illustrates a fixed size block of pixels in accordance with one or more aspects of the present invention.

FIG. 5A illustrates a fixed size block of 16 pixels, block 500, in accordance with one or more aspects of the present invention. As previously mentioned with respect to the medium quality compression scheme, other embodiments of the present invention may include fewer or more pixels in an N×M dimension block, where N and M are each integers. Each pixel may include one or more channels of data, e.g., red, green, blue, alpha, depth, or the like. Each channel is compressed separately to reduce any cross-channel interactions. Blocks of compressed channels may then be interleaved when stored or stored separately.

Four anchor points, 501, 502, 503, and 504, are computed for block 500. Each anchor point value is the approximate average of the four pixels surrounding the anchor point. For example, anchor point 501 is the approximate average (for each channel) of pixels 510, 512, 513, and 522. Likewise, anchor point 502 is the approximate average (for each channel) of pixels 511, 514, 515, and 523, anchor point 503 is the approximate average (for each channel) of pixels 516, 517, 520, and 524, and anchor point 504 is the approximate average (for each channel) of pixels 518, 519, 521, and 525. In some embodiments of the present invention, an anchor point is computed using the following equation:

Anchor point=(pixel0+pixel1+pixel2+pixel3)>>2, where pixel0, pixel1, pixel2, and pixel 3 are the four pixels surrounding the anchor point.

Figure 6A:
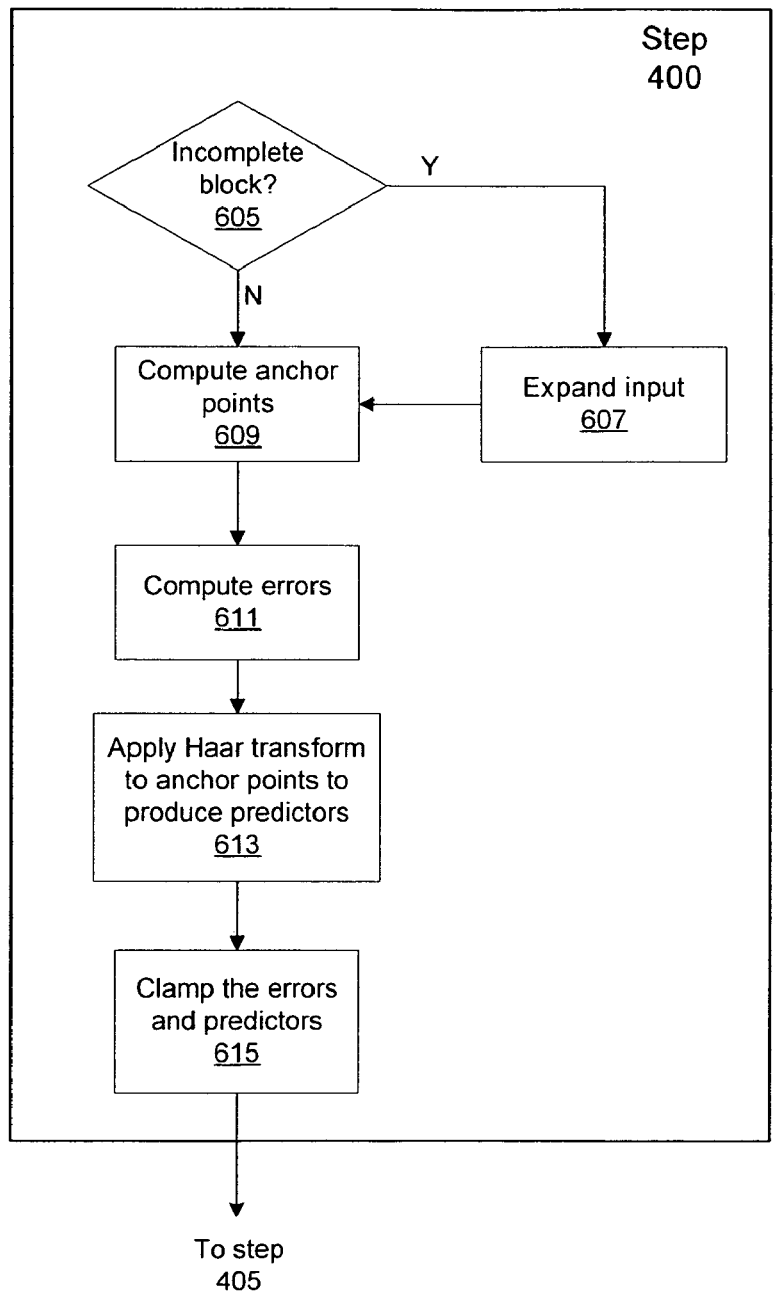
FIG. 6A illustrates a flow diagram of an exemplary method of performing a step shown in FIG. 4 in accordance with one or more aspects of the present invention.

The anchor point values are processed to produce 4 predictor values, as described in conjunction with FIG. 6A, which are stored in the high quality compressed format. Error values are computed for pixels 510, 511, 512, 513, 514, 515, 516, 517, 518, 519, 520, and 520, as described in conjunction with FIG. 6A, and are stored in the high quality compressed format. Notably, error values are not computed or stored for pixels 522, 523, 524, and 525. The channel values for those pixels may be derived using the anchor point values and 3 other pixel values associated with each anchor point. For example, one or more channel values for pixel 522 may be computed using the corresponding one or more channel values for anchor point 501 and pixels 510, 513, and 512. As previously mentioned in reference to the medium quality compression scheme, missing pixels may be assigned a value of zero or a value representing the mean of the existing pixels within block 500.

In one embodiment of the present invention there are three different configurations of the data fields for a high quality compressed pixel block. The number of bits stored for each of the twelve error values is consistent, but the number of bits stored for each of the four predictors varies between the different configurations. The configuration used for a particular block is determined based on the number of bits in the predictor values, as described in conjunction with FIG. 6B.

Figure 5B:
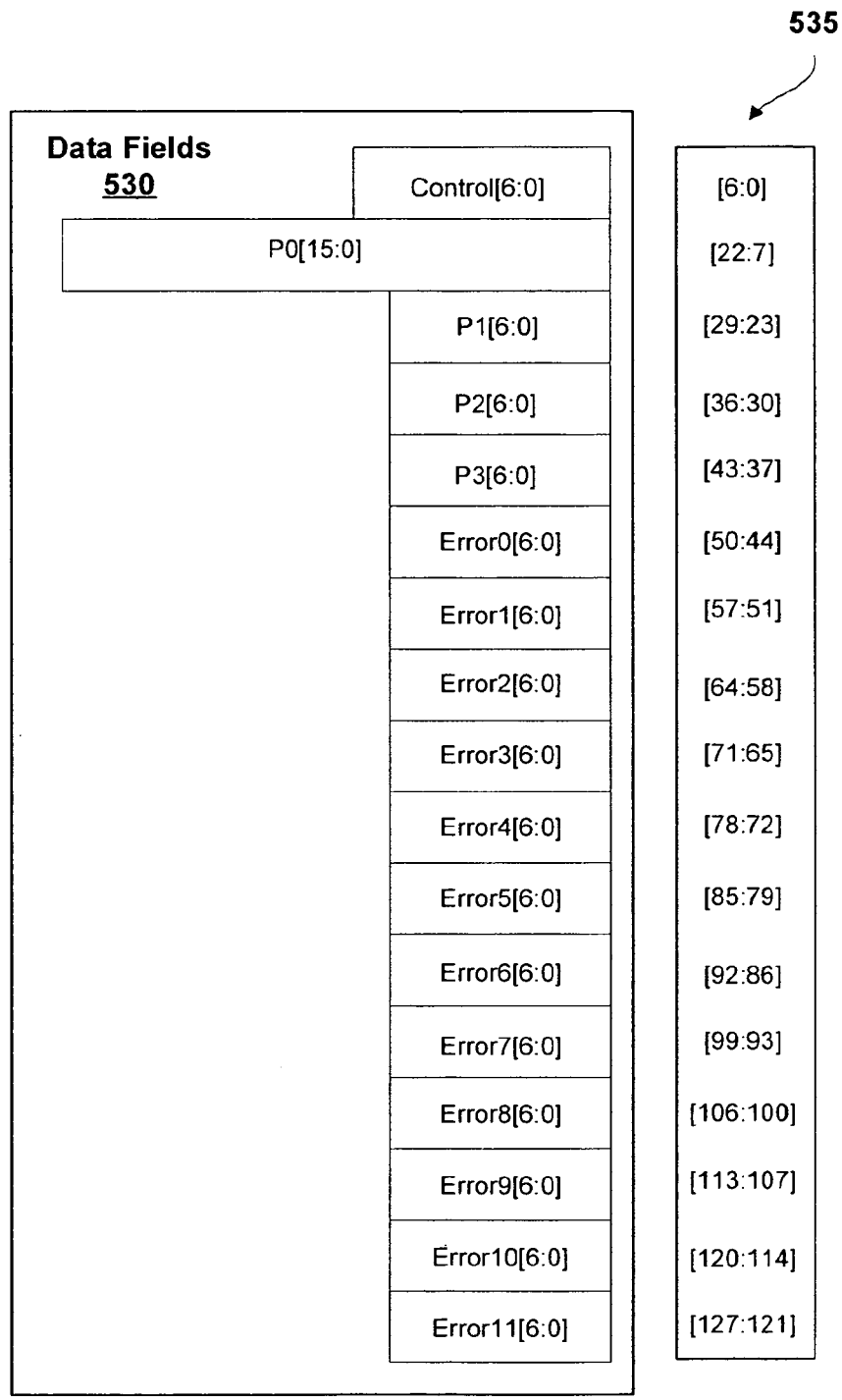
FIGS. 5B, 5C, and 5D illustrate data fields of another compression format representing a fixed size block of pixels in accordance with one or more aspects of the present invention.

FIG. 5B illustrates a first configuration of the data fields of the high quality compression format, data fields 530, representing a channel of a fixed size block of pixels, such as block 500, in accordance with one or more aspects of the present invention. Data fields 530 is represented by 128 bits, compression format bits 535, and includes a 7 bit control field, a 16 bit field storing a first predictor value, three 7 bit fields storing second, third, and fourth predictor values, and twelve 7 bits fields storing error values for twelve pixels. The 7 bit control field occupies bits [6:0] of compression format bits 535. The first predictor value occupies bits [22:7] of compression format bits 535. The remaining fields in data fields 530, the second, third, and fourth predictor values, and twelve error values, are packed into the remaining bits of compression format bits 535, bits [29:23], [36:30], [43:37], and [127: 44], respectively, as shown in FIG. 5B.

Figure 5C:
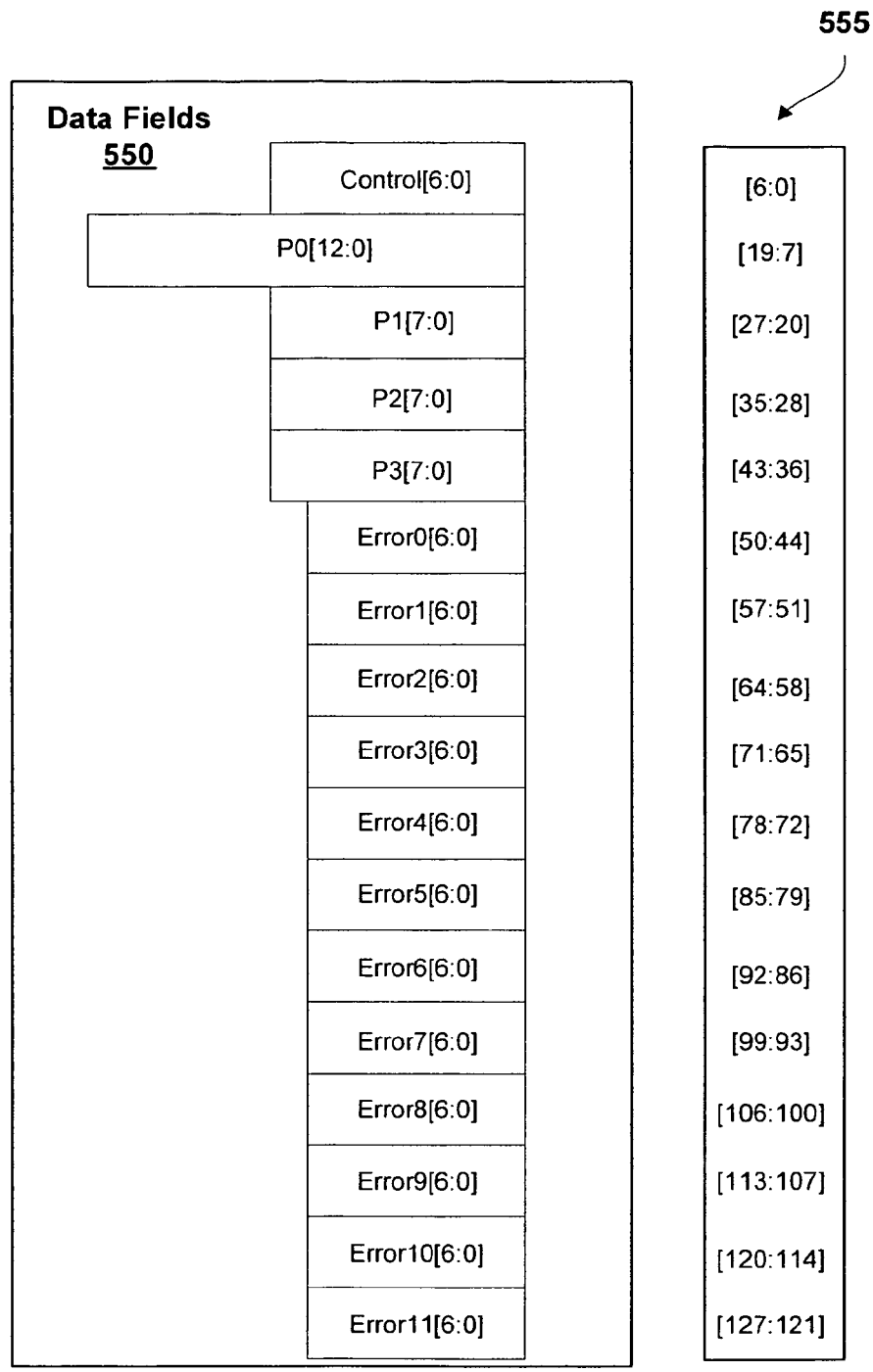

FIG. 5C illustrates a second configuration of the data fields of the high quality compression format data fields 550, representing a channel of a fixed size block of pixels, such as block 500, in accordance with one or more aspects of the present invention. Data fields 550 is represented by 128 bits, compression format bits 555, and includes a 7 bit control field, a 13 bit field storing a first predictor value, three 8 bit fields storing second, third, and fourth predictor values, and twelve 7 bits fields storing error values for twelve pixels. The 7 bit control field occupies bits [6:0] of compression format bits 555. The first predictor value occupies bits [19:7] of compression format bits 555. The remaining fields in data fields 550, the second, third, and fourth predictor values, and twelve error values, are packed into the remaining bits of compression format bits 555, bits [27:20], [35:28], [43:36], and [127:44], respectively, as shown in FIG. 5C.

Figure 5D:
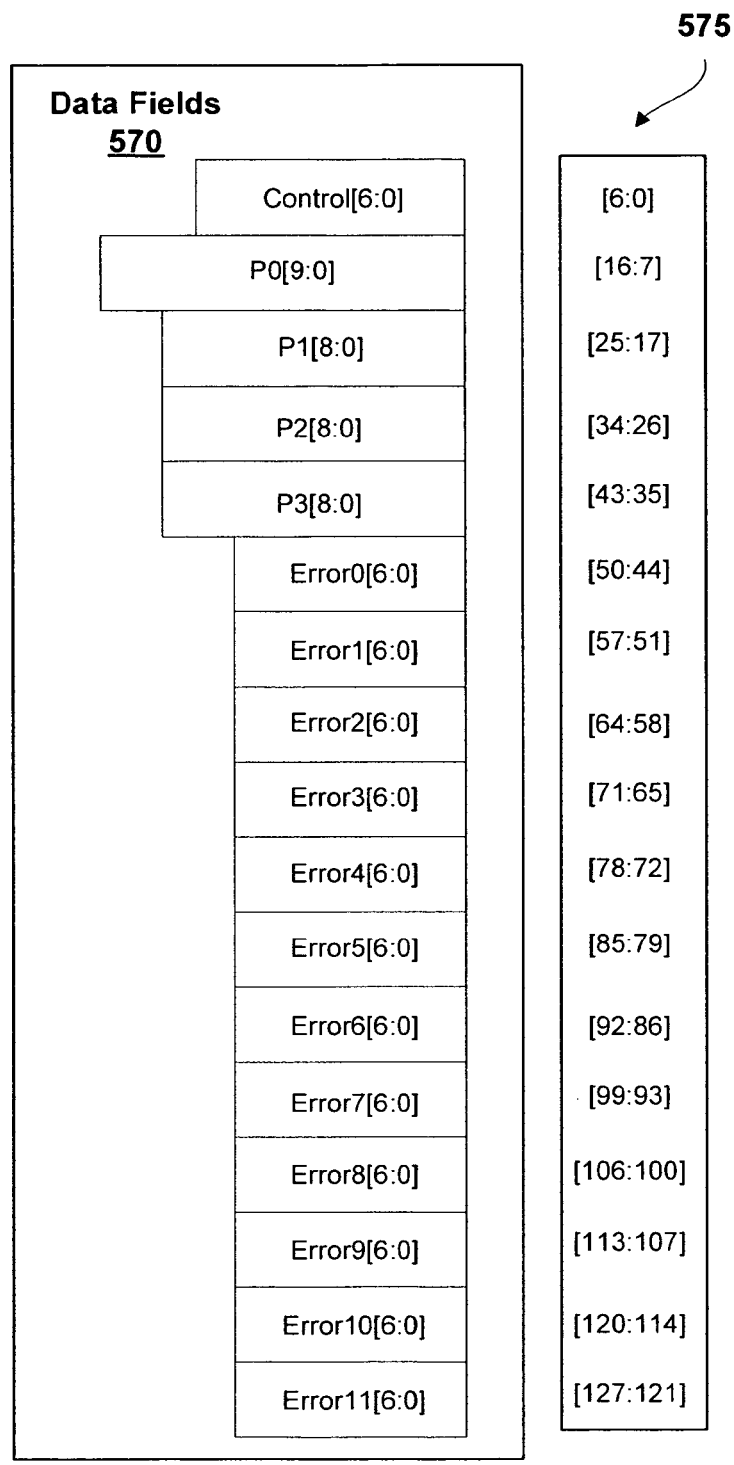

FIG. 5D illustrates a third configuration of the data fields of the high quality compression format data fields 570, representing a channel of a fixed size block of pixels, such as block 500, in accordance with one or more aspects of the present invention. Data fields 570 is represented by 128 bits, compression format bits 575, and includes a 7 bit control field, a 10 bit field storing a first predictor value, three 9 bit fields storing second, third, and fourth predictor values, and twelve 7 bit fields storing error values for twelve pixels. The 7 bit control field occupies bits [6:0] of compression format bits 575. The first predictor value occupies bits [16:7] of compression format bits 575. The remaining fields, the second, third, and fourth predictor values, and twelve error values, are packed into the remaining bits of compression format bits 575, bits [25:17], [34:26], [43:35], and [127:44], respectively, as shown in FIG. 5D.

FIG. 6A illustrates a flow diagram of an exemplary method of performing step 400 shown in FIG. 4 in accordance with one or more aspects of the present invention. In step 650 the method determines if the block, such as block 500 is incomplete, i.e., only a portion of the block is filled with pixels, and, if so, in step 607 the input is expanded to fill the block. In one embodiment of the present invention, the input is expanded by appending zeros until the block is filled, i.e., includes 256 bits. In other embodiments of the present invention, the input is expanded by appending the mean of the existing pixels until the block is filled. In still other embodiments of the present invention, the value a particular pixel, such as the pixel positioned at x=0 and y=0, is replicated until the block is filled. If, in step 650 the method determines that the block is complete, then the method proceeds directly to step 609. In some embodiments of the present invention, when a block includes a NaN value, the control field is set to a specific reserved value.

In step 609 the anchor point values are computed. As previously described, an anchor point value for a channel is approximately the average of the channel values of the four pixels surrounding the anchor point. In step 611 the errors are computed for twelve of the sixteen pixels within the block, specifically pixels 510, 511, 512, 513, 514, 515, 516, 517, 518, 519, 520, and 520 in block 500. In some embodiments of the present invention, the following function is used to compute the predicted values:

predicted value($dx,dy$)=(($a0*(4-(dx))*(4-(dy))$+
$a1*(dx)*(4-(dy))+a2*(4-(dx))*(dy)$+
$a3*(dx)*(dy)$)>>4), where a0, a1, a2, and a3 are anchor values 501, 502, 503, and 504, respectively. The error values are computed using the predicted values:

error($dx,dy$)=actual value($dx,dy$)−
predicted value($dx,dy$).

Table 3 illustrates the dx and dy values used for each of the twelve pixels.

TABLE 3

| pixel | dx | dy |
|-------|----|----|
| 510   | 1  | −1 |
| 511   | 3  | −1 |
| 512   | −1 | 1  |
| 513   | 1  | 1  |
| 514   | 3  | 1  |
| 515   | 5  | 1  |
| 516   | −1 | 3  |

TABLE 3-continued

| pixel | dx | dy |
|---|---|---|
| 517 | 1 | 3 |
| 518 | 3 | 3 |
| 519 | 5 | 3 |
| 520 | −1 | 5 |
| 521 | 1 | 5 |

In step 613 a Haar transform is applied to the anchor points to produce four predictor values. In some embodiments of the present invention a function may be used to perform step 613. The code shown in Table 4 represents such a function, where A0, A1, A2, and A3 are values of anchor points 501, 502, 503, and 504 respectively. P0, P1, P2, and P3 are predictor values corresponding to anchor points 501, 502, 503, and 504 respectively. By way of illustration, the code is defined using C. However, any other language may be used to define the function.

TABLE 4

```
P1 = A1 − A0;
P3 = A3 − A2;
P0 = A0 + (P1/2);
P2 = A2 + (P3/2);
P2 = P2 − P0;
P0 = P0 + (P2/2);
```

P0 is the mean of all of the pixels in the block which may be a useful value to access for each compressed block.

In step 615 the error values and predictor values are clamped to a maximum value and a minimum value that may be represented by 17 bits, 65535 and −65536 respectively. Although the predictor values cannot exceed the 17 bit range, it is possible, through unlikely, that the error values may slightly exceed the 17 bit range.

Figure 6B:
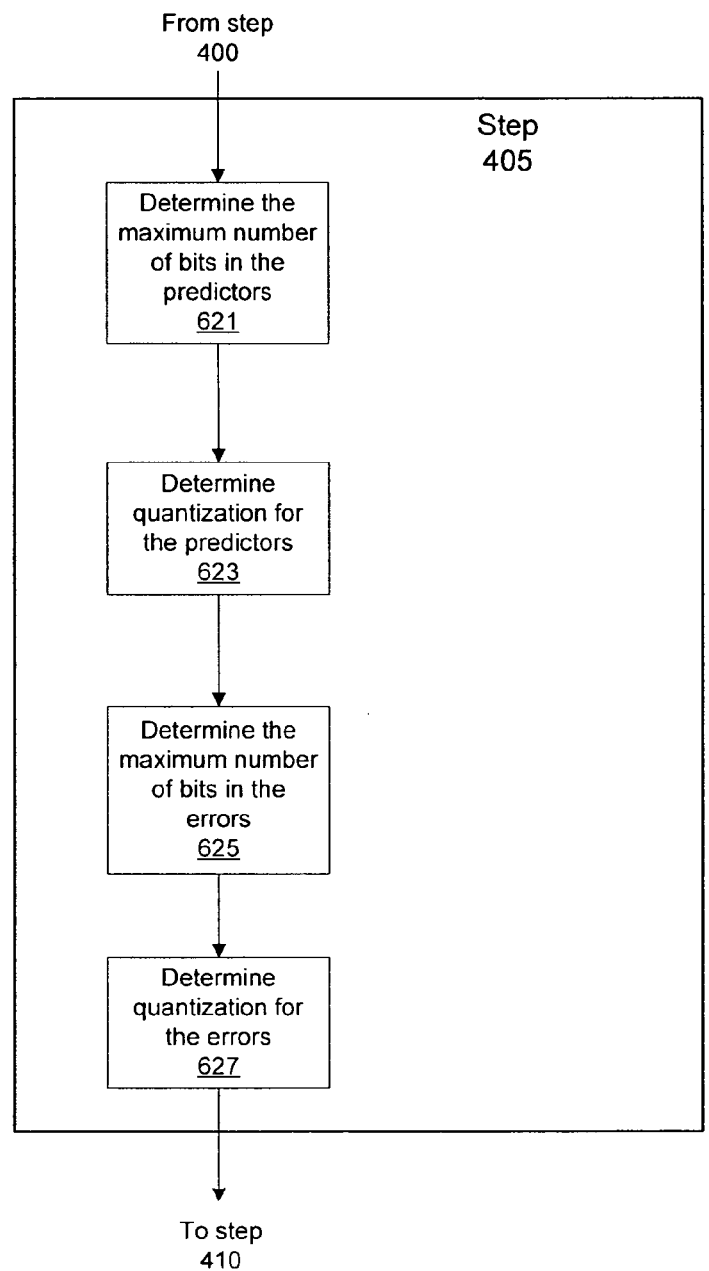
FIG. 6B illustrates a flow diagram of an exemplary method of performing another step shown in FIG. 4 in accordance with one or more aspects of the present invention.

FIG. 6B illustrates a flow diagram of an exemplary method of performing step 405 shown in FIG. 4 in accordance with one or more aspects of the present invention. In step 621 the method determines the number of bits in predictor values P1, P2, and P3 and selects the greatest number as the maximum number of bits in the predictors, nbits1. In some embodiments of the present invention, a function may be used to perform step 621. The code shown in Table 5 represents such a function, where n is replaced with a predictor value and i is the minimum number of bits needed to store the value n. By way of illustration, the code is defined using C. However, any other language may be used to define the function.

TABLE 5

```
static int
countbits (int n)
{
    {n = ((n)>=0) ? (2*(n)) : (−2*(n)−1);
    int i;
    for (i = 0; n; ++i, n >>=1)
        ;
    return i;
}
```

The code shown in Table 6 represents another function that may be used to perform step 621. By way of illustration, the code is defined using C. However, any other language may be used to define the function.

TABLE 6

```
static int
countbits (int n)
}
    if (n < 0)
        n = ~n;
    int i;
    for (i = 1; n; ++i, n >>=1)
        ;
    return i;
}
```

In step 623 the method determines the quantization, Q1, for all of the predictor values, P0, P1, P2, and P3. The quantization is applied to the predictor values in step 410 and is described in conjunction with FIG. 6C. In step 625 the method determines the number of bits in the twelve error values and selects the greatest number as the maximum number of bits in the errors, nbits2. In step 627 the method determines the quantization, Q2, for all of the error values. Q2 is equal to the greater of 0 and (nbits2-7).

Figure 6C:
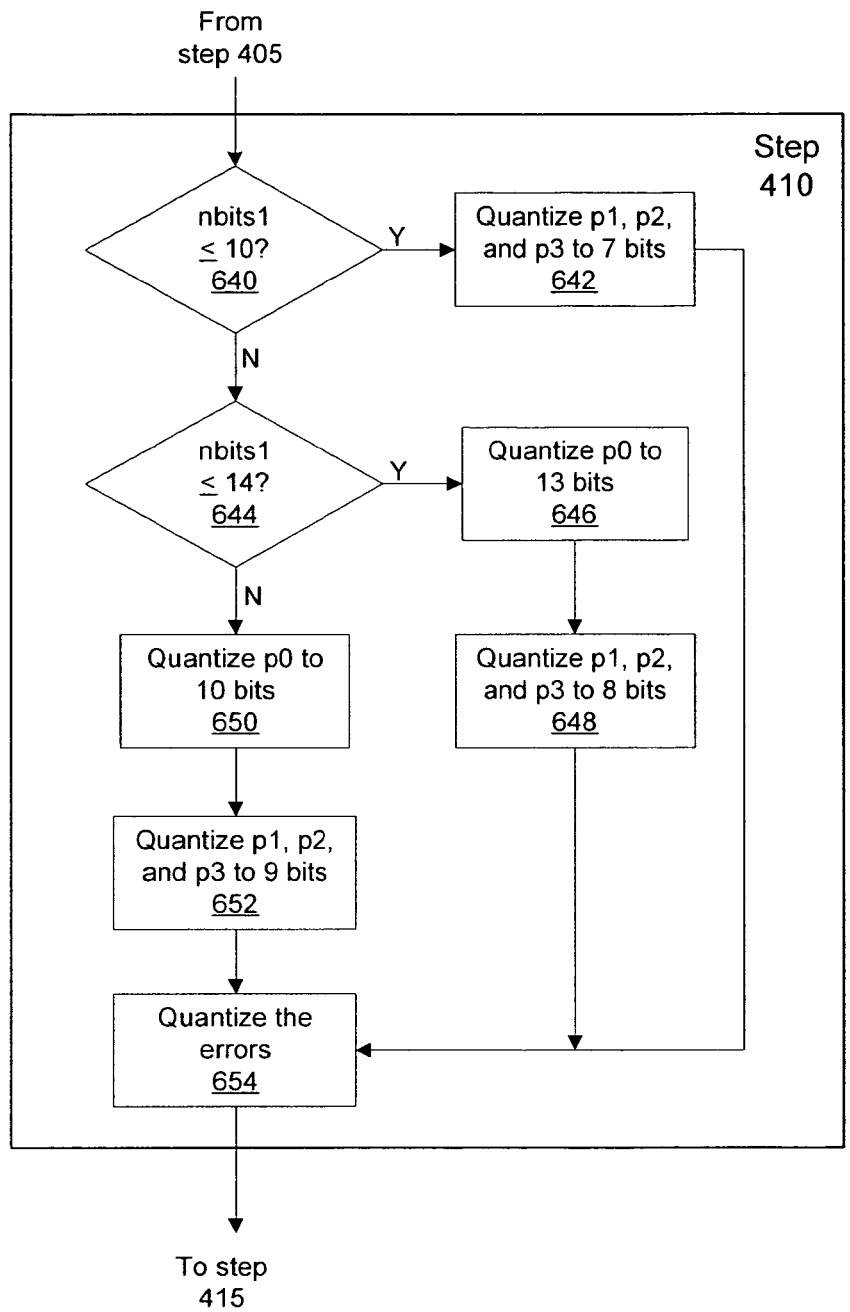
FIG. 6C illustrates a flow diagram of an exemplary method of performing another step shown in FIG. 4 in accordance with one or more aspects of the present invention.

FIG. 6C illustrates a flow diagram of an exemplary method of performing step 410 shown in FIG. 4 in accordance with one or more aspects of the present invention. Table 7 illustrates the quantization for P0, P1, P2, and P3, i.e., the number of bits used to represent each predictor in the high quality compressed format, based on nbits1.

TABLE 7

| nbits1 | Q1 | P0 size | P1 size | P2 size | P3 size |
|---|---|---|---|---|---|
| 0-7 | 0 | 16 | 7 | 7 | 7 |
| 8 | 1 | 16 | 7 | 7 | 7 |
| 9 | 2 | 16 | 7 | 7 | 7 |
| 10 | 3 | 16 | 7 | 7 | 7 |
| 11 | 3 | 13 | 8 | 8 | 8 |
| 12 | 4 | 13 | 8 | 8 | 8 |
| 13 | 5 | 13 | 8 | 8 | 8 |
| 14 | 6 | 13 | 8 | 8 | 8 |
| 15 | 6 | 10 | 9 | 9 | 9 |
| 16 | 7 | 10 | 9 | 9 | 9 |
| 17 | 8 | 10 | 9 | 9 | 9 |

In step 640 the method determines if nbits1 is less than or equal to 10, and, if so, in step 642 predictor values P1, P2, and P3 are each quantized to a size of 7 bits. Predictor value P0 is not quantized and retains 16 bits. This quantization results in the high quality compression format data field configuration shown in FIG. 5B. Quantization preserves the high order bits of the predictor values. In some embodiments of the present invention, a function may be used to perform step 642. The code shown in Table 8 represents one such function, where x is replaced with P1, P2, and P3 and bits is replaced with the number of bits used to represent the predictor value according to Table 7. By way of illustration, the code is defined using C. However, any other language may be used to define the function.

TABLE 8

```
#define  QUANTIZE(x,bits)    ( ((x)<0) ? (-(((-(x))>>(bits))) :
                              ((x)>>(bits)) ).
```

The code shown in Table 9 represents another such function for performing step 642, where x is replaced with P1, P2, and P3 and size is replaced with the number of bits used to represent the predictor value according to Table 7. By way of illustration, the code is defined using C. However, any other language may be used to define the function.

TABLE 9

```
        #define    BIT(n)       (1<<(n))
        #define    MASK(n)      (BIT((n)) – 1)
#define ENC(x,size,bits)  ( ((x)>>(bits)) & MASK(size) )
```

If, in step 640 the method determines that nbits1 is greater than 10, then in step 644 the method determines if nbits1 is less than or equal to 14. If nbits1 is less than or equal to 14, then in step 646 predictor value P0 is quantized to a size of 13 bits and in step 648 predictor values P1, P2, and P3 are each quantized to a size of 8 bits. This quantization results in the high quality compression format data field configuration shown in FIG. 5C. If in step 644 nbits1 is greater than 14, then in step 650 predictor value P0 is quantized to a size of 10 bits and in step 652 predictor values P1, P2, and P3 are each quantized to a size of 9 bits. This quantization results in the high quality compression format data field configuration shown in FIG. 5C. In step 654 the error values are each quantized to a size of 7 bits. The error values are quantized to fit within 7 bits, specifically, the 7 msbs of the largest error(s). Therefore, the largest error(s) will have all 7 msbs restored upon decompression. Any smaller errors will not necessarily have their 7 msbs restored upon decompression.

Figure 6D:
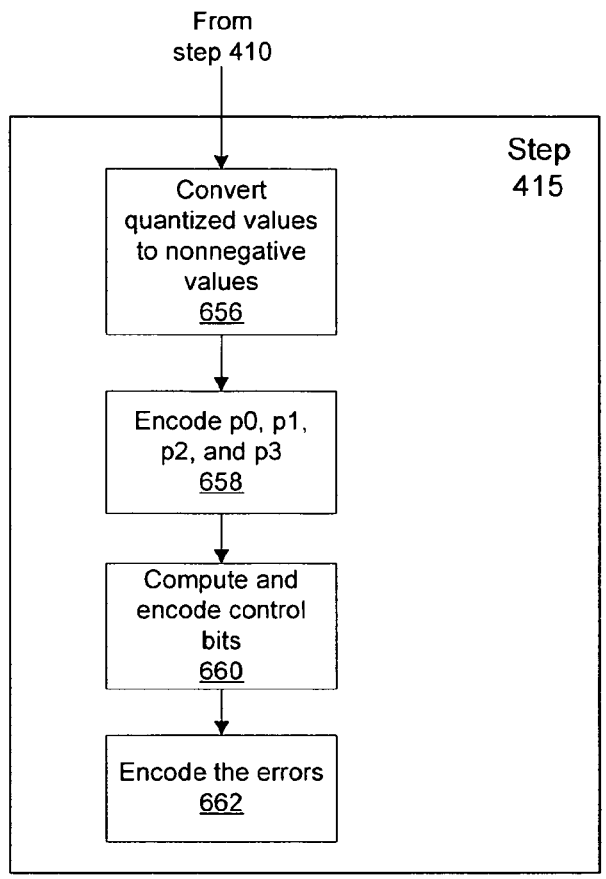
FIGS. 6D and 6E illustrate flow diagrams of exemplary methods of performing another step shown in FIG. 4 in accordance with one or more aspects of the present invention.

FIG. 6D illustrates a flow diagram of an exemplary method of performing step 415 shown in FIG. 4 in accordance with one or more aspects of the present invention. In step 656 the quantized predictor values and quantized error values are converted to nonnegative values. In some embodiments of the present invention, a function may be used to perform step 656. The code shown in Table 10 represents such a function, where x is replaced with the quantized predictor and error values. By way of illustration, the code is defined using C. However, any other language may be used to define the function.

TABLE 10

```
#define  MAKENONNEGATIVE(x)   ((x)>=0) ? (2*(x)) : (-2*(x)-1).
```

In step 658 the quantized predictor values, P0, P1, P2, and P3 are encoded into the compressed data format. Depending on the quantization, one of the data field configurations shown in FIG. 5B, 5C, or 5D is used. In step 660 the 7 bit control is computed:

control[6:0]=nbits1code*11+Q2, where nbits1code is the greater of 0 and (nbits1-7). As previously described, Q2 is the greater of 0 and (nbits2-7), where nbits2 is the maximum number of bits needed to represent the error values.

In step 662 the quantized and nonnegative error values are encoded into the compressed data format as twelve 7 bit values stored in the fields shown in FIGS. 5B, 5C, and 5D.

Figure 6E:
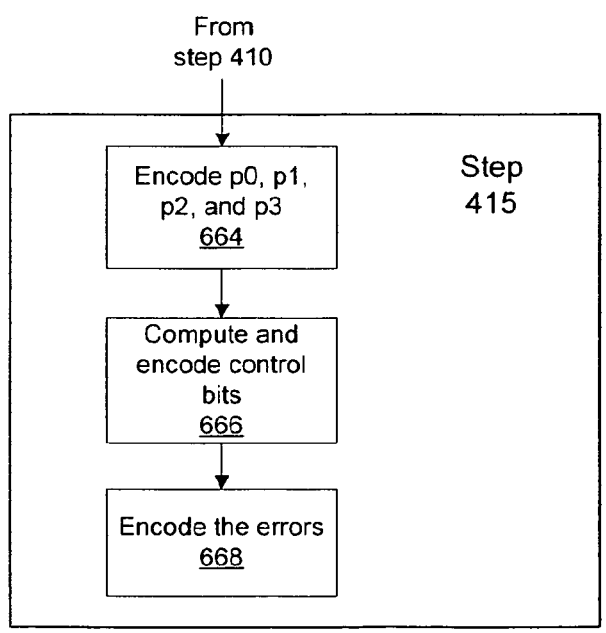

FIG. 6E illustrates another flow diagram of an exemplary method of performing step 415 shown in FIG. 4 in accordance with one or more aspects of the present invention. Compared with the flow diagram shown in FIG. 6D, step 656 is omitted and negative and nonnegative values may be encoded in steps 664 and 668. In step 664 the quantized predictor values, P0, P1, P2, and P3 are encoded into the compressed data format. Depending on the quantization, one of the data field configurations shown in FIG. 5B, 5C, or 5D is used. Step 666 corresponds to step 660 and is performed as previously described in conjunction with FIG. 6D.

In step 668 the quantized and error values are encoded into the compressed data format as twelve 7 bit values stored in the fields shown in FIGS. 5B, 5C, and 5D. Persons skilled in the art will appreciate that any system configured to perform the method steps of FIG. 6A, 6B, 6C, 6D, or 6E or their equivalents, is within the scope of the present invention.

Figure 7A:
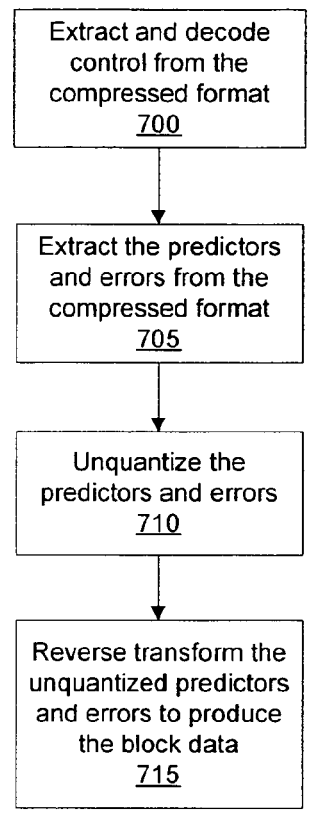
FIG. 7A illustrates a flow diagram of an exemplary method of decompressing data represented in a high quality compression format in accordance with one or more aspects of the present invention.

FIG. 7A illustrates a flow diagram of an exemplary method of decompressing 16 bit data represented in the high quality compression format in accordance with one or more aspects of the present invention. In step 700 the method extras and decodes the control information, control[6:0], from the compressed format. nbits1 is computed as control[6:0]/11+7. Q1 is determined using Table 7 and nbits1. Q2 is computed as the remainder of control[6:0] divided by 11. In some embodiments of the invention, specific reserved values are defined for control[6:0]. For example, a value of 127 may be used to indicate that the compressed block includes NaN values, and all of the 16 bit decompressed values are set to NaN, completing decompression of the block.

In step 705 the predictors (quantized) are extracted from the compressed format using Q1 or nbits1 to determine the data field configuration used for the high quality compression format. The errors (also quantized) are also extracted from the compressed format. In step 710 the extracted predictors and errors are unquantized. Specifically, bits removed during quantization of the predictors and errors are restored. In some embodiments of the present invention, a function may be used to perform step 710. The code shown in Table 11 represents such a function, where x is replaced with the extracted negative or nonnegative predictors P1, P2, and P3 and bits is replaced with Q1. Similarly, x may be replaced with the extracted negative or nonnegative errors and bits may be replaced with Q2. For extracted predictor P0, bits may be replaced with 3 or 6 depending on the data field configuration used for the high quality compression format. The flag input controls the rounding factor and the size input is the size of the bitfield that the data was stored in, e.g., 7 bits for the 12 error values. The MASK and BIT operations are specified in Table 9. By way of illustration, the code is defined using C. However, any other language may be used to define the function.

TABLE 11

```
static int
dec(int x, int size, int bits, int flag)
{
        assert (size > 0 && bits >= 0);
        // extend sign bit
        if (x & BIT(size – 1))
                x |= (~0) << size;
        if (bits == 0)
                return x;
        // decode
        x <<= bits;
        if (flag)
                x |= MASK(bits-1);
        else
                x |= BIT (bits-1);
        return x;
}
```

The rounding factor may be modified for each computation by changing the flag input. For example when quantized predictor P0 is quantized from 16 bits to 13 bits, unquantization appends 3 lsbs, a rounding factor, to predictor P0. When the function shown in Table 11 is used with the flag input set to 0, the 3 bit rounding factor is 100 and when the flag input is set to 1, the 3 bit rounding factor is 011. In some embodiments of the present invention the flag may be set to 1 for predictors P1 and P2 and the error values corresponding to pixels 510, 512, 514, 517, 519, and 521 of block 500. In the same embodiments of the present invention the flag may be set to 0 for predictors P0 and P3 and the error values corresponding to pixels 511, 513, 515, 516, 518, and 520 of block 500.

Figure 7B:
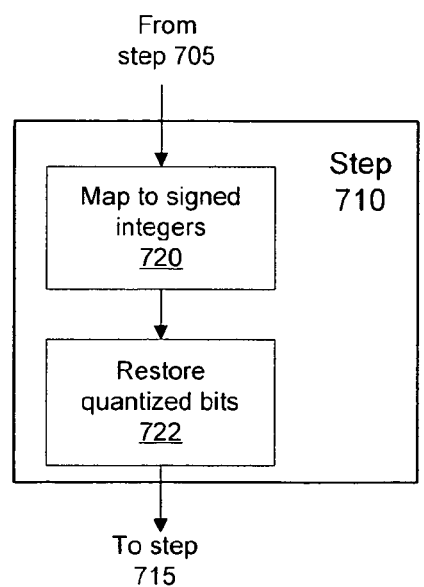
FIG. 7B illustrates a flow diagram of an exemplary method of performing a step shown in FIG. 7A in accordance with one or more aspects of the present invention.

In other embodiments of the present invention, particularly those embodiments using only nonnegative quantized errors and predictors, step 710 is performed as described in conjunction with FIG. 7B. In step 715 the unquantized predictors and errors are reverse transformed, as described in conjunction with FIG. 7C, to produce the block data, sixteen 16 bit pixel values.

FIG. 7B illustrates a flow diagram of an exemplary method of performing step 710 shown in FIG. 7A in accordance with one or more aspects of the present invention. In step 720 the extracted predictors and errors are mapped to signed integers, i.e., the conversion to nonnegative values is reversed. In some embodiments of the present invention, a function may be used to perform step 720. The code shown in Table 12 represents such a function, where x is replaced with the extracted predictor and error values. By way of illustration, the code is defined using C. However, any other language may be used to define the function.

TABLE 12

| |  |
|---|---|
| #define | UNMAKENONNEGATIVE(x) ((x)&1) ? (-(((x)+1)/2)) : ((x)/2). |

In step 722 bits removed during quantization of the predictors and errors are restored. In some embodiments of the present invention, a function may be used to perform step 722. The code shown in Table 13 represents such a function, where x is replaced with the extracted predictors P1, P2, and P3 and bits is replaced with Q1. Similarly, x may be replaced with the extracted errors and bits may be replaced with Q2. For extracted predictor P0 bits may be replaced with 3 or 6 depending on the data field configuration used for the high quality compression format. The flag input controls the rounding factor. By way of illustration, the code is defined using C. However, any other language may be used to define the function.

TABLE 13

```
UNQ(int x, int bits, int flag)
{
    assert (bits >= 0);
    if (bits == 0)
        return x;
    else if (x < 0)
    {
        x = -x;
        x <<= bits;
        x |= (1 << (bits-1)) - (flag == 0);
        return -x;
    }
    else
    {
        x <<= bits;
        x |= (1 << (bits-1)) - (flag == 0);
        return x;
    }
}
```

The rounding factor may be modified for each computation by changing the flag input as previously described in conjunction with Table 11.

Figure 7C:
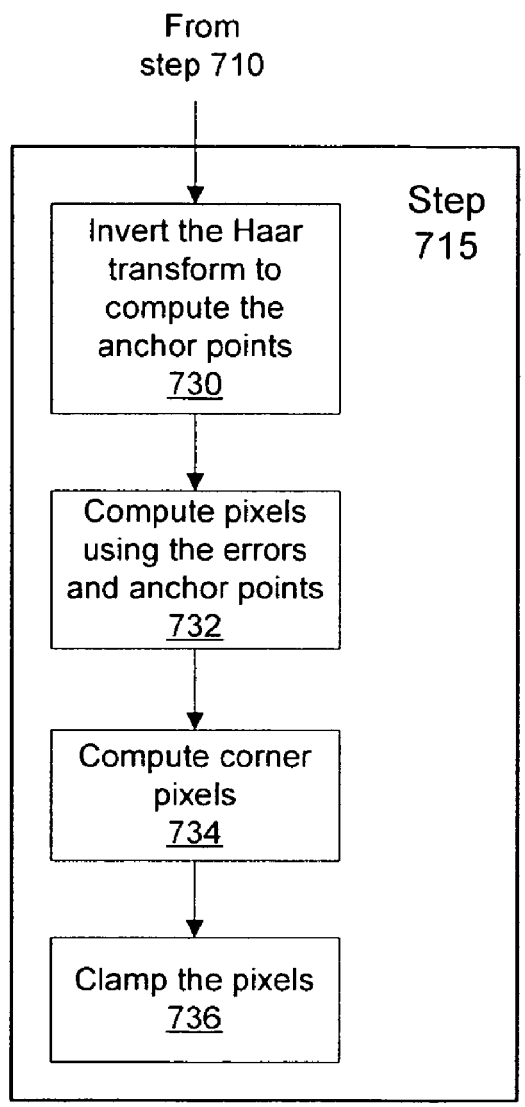
FIG. 7C illustrates a flow diagram of an exemplary method of performing another step shown in FIG. 7A in accordance with one or more aspects of the present invention.

FIG. 7C illustrates a flow diagram of an exemplary method of performing step 715 shown in FIG. 7A in accordance with one or more aspects of the present invention. In step 730 the Haar transform performed in step 613 is inverted to compute the anchor points from the predictor values. In some embodiments of the present invention a function may be used to perform step 730. The code shown in Table 14 represents such a function, where A0, A1, A2, and A3 are values of anchor points 501, 502, 503, and 504 respectively. P0, P1, P2, and P3 are predictor values corresponding to anchor points 501, 502, 503, and 504 respectively. By way of illustration, the code is defined using C. However, any other language may be used to define the function.

TABLE 14

A0 = P0 − (P2/2);
A2 = P2 + A0;
A2 = A2 − (P3/2);
A0 = A0 − (P1/2);
A3 = P3 + A2;
A1 = P1 + A0;

In step 732 the twelve pixel values are computed using the twelve errors and four anchor points, specifically values are computed for pixels 510, 511, 512, 513, 514, 515, 516, 517, 518, 519, 520, and 520 in block 500. In some embodiments of the present invention, the function previously described in conjunction with step 611 and the dx and dy values shown in Table 3 are used to compute the pixel values instead of error values.

In step 734 values are computed for pixels 522, 523, 524, and 525 using the anchor point values and computed values for 510, 511, 512, 513, 514, 515, 516, 517, 518, 519, 520, and 520 in block 500. In some embodiments of the present invention a function may be used to perform step 734. The code shown in Table 15 represents such a function, where A0, A1, A2, and A3 are values of anchor points 501, 502, 503, and 504 respectively. P0, P1, P2, and P3 are predictor values corresponding to anchor points 501, 502, 503, and 504 respectively. By way of illustration, the code is defined using C. However, any other language may be used to define the function.

TABLE 15

Pixel 522 = ((A0 << 2) − pixel 510 − pixel 512 − pixel 513 + 1);
Pixel 523 = ((A1 << 2) − pixel 511 − pixel 514 − pixel 515 + 2);
Pixel 524 = ((A2 << 2) − pixel 516 − pixel 517 − pixel 520 + 2);
Pixel 525 = ((A3 << 2) − pixel 518 − pixel 519 − pixel 521 + 1);

In step 736 the pixel values are clamped to a maximum value and a minimum value that may be represented by 16 bits, 32768 and −32767 respectively. In some embodiments of the present invention, the pixel values are clamped to different values depending on the 16 bit format used to represent the pixel data, e.g., unsigned, signed, or floating point. For example, in some embodiments of the present invention a function may be used to perform step 736. The code shown in Table 16 represents such a function, where in is the input pixel value and out is the clamped pixel value. By way of illustration, the code is defined using C. However, any other language may be used to define the function.

TABLE 16

```
if (format_is_unsigned_16)
    out = MIN(65535, MAX(0, in));
else if (format_is_signed_16)
    out = MIN(32767, MAX(−32768, in));
else if (format_is_float_16)
    // 0x7bff is MAXFLT for float_16
```

TABLE 16-continued

```
in = MIN(0x7bff, MAX(-0x7bff, in)));
out = (in < 0) ? (0x8000 | -in) : in;
```

Persons skilled in the art will appreciate that any system configured to perform the method steps of FIG. 7A, 7B, or 7C or their equivalents, is within the scope of the present invention.

Figure 8A:
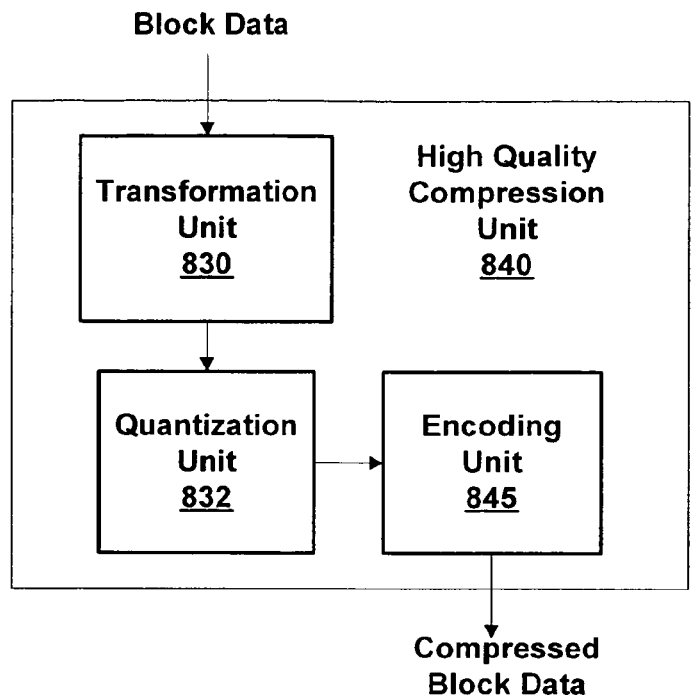
FIG. 8A is a block diagram of a compression unit in accordance with one or more aspects of the present invention.

FIG. 8A is a block diagram of a high quality compression unit 840 in accordance with one or more aspects of the present invention. A transformation unit 830 within high quality compression unit 840 receives block data, such as pixel values for one or more channels. In some embodiments of the present invention, high quality compression unit 840 is configured to only compress pixel values when the block is filled, i.e., all sixteen pixels are populated. When the block is not filled, in those embodiments, the uncompressed 16 bit pixel values are output by high quality compression unit 840.

Transformation unit 830 is configured to perform the method steps of FIG. 6A. Specifically, transformation unit 830 computes the block anchor point values, computes the error values, applies the Haar transform to compute the predictor values. Transformation unit 830 also clamps the error and predictor values for a 16 bit representation. Transformation unit 830 outputs the clamped error and predictor values to a quantization unit 832. Quantization unit 832 is configured to perform the method steps of FIGS. 6B and 6C. Specifically, quantization unit 832 determines the quantization values, e.g., Q1 and Q2, for the predictor values and for the error values. Quantization unit 832 also quantizes the predictor values and error values and outputs the quantized values and quantization values to an encoding unit 845. Encoding unit 845 computes the control information, control[6:0] and places the quantized predictors and errors in data fields based on the control information, where the data field configuration corresponds to one of the high quality compressed formats shown in FIG. 5B, 5C, or 5D. Encoding unit 845 outputs the compressed data represented in the high quality compressed format as compressed block data.

Figure 8B:
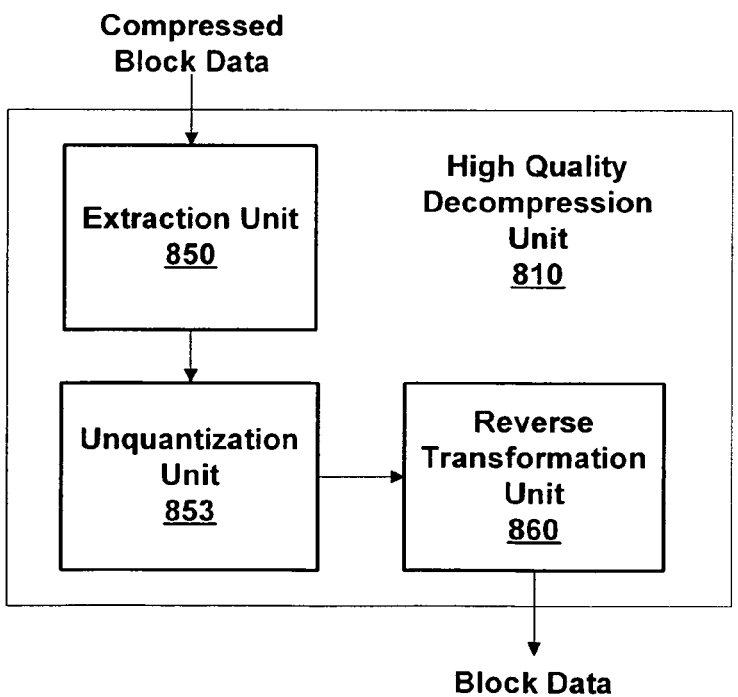
FIG. 8B is a block diagram of another decompression unit in accordance with one or more aspects of the present invention.

FIG. 8B is a block diagram of a high quality decompression unit 810 in accordance with one or more aspects of the present invention. An extraction unit 850 within high quality decompression unit 810 receives compressed block data and extracts the control information from the compressed block data. Extraction unit 850 then extracts the quantized predictor values and quantized error values from the compressed block data based on the control information. Extraction unit 850 outputs extracted control information, quantized predictor values, and quantized error values to an unquantization unit 853. Unquantization unit 853 is configured to perform the method step 710 of FIG. 7A. In some embodiments of the present invention, unquantization unit 853 maps the quantized predictor values and quantized error values to signed values. Unquantization unit 853 restores quantized bits to produce the predictor values and error values. Unquantization unit 853 outputs the predictor values and error values to a reverse transformation unit 860 which is configured to perform the method steps of FIG. 7C. Specifically. Transformation unit 860 applies the inverted Haar transform to the predictor values to compute the anchor point values. The sixteen pixel values are then computed using the anchor point values and the error values. Transformation unit 860 also clamps the pixel values to produce the block data for block 500.

Figure 8C:
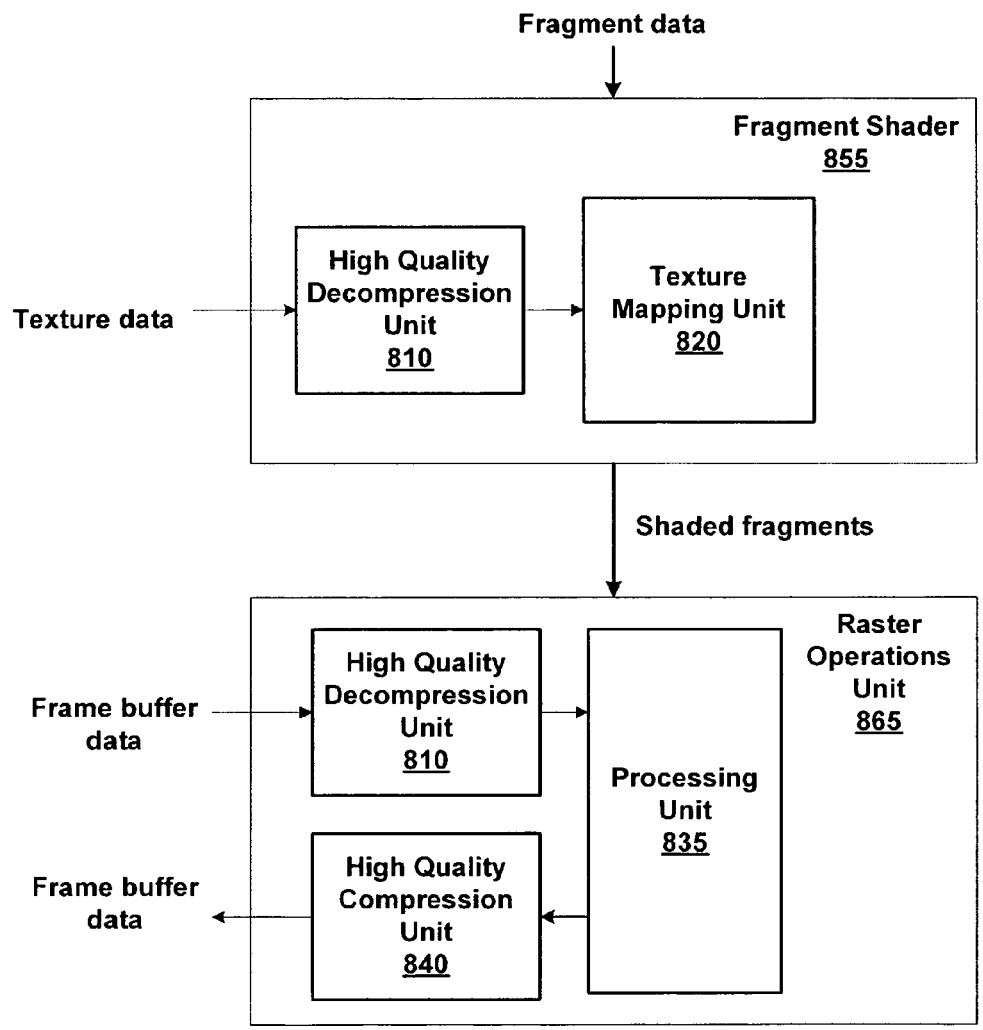
FIG. 8C is a block diagram of a portion of a graphics processor including the compression and the decompression unit shown in FIGS. 8A and 8B, respectively, in accordance with one or more aspects of the present invention.

FIG. 8C is a block diagram of a portion of a graphics processor including the compression and the decompression unit shown in FIGS. 8A and 8B, respectively, in accordance with one or more aspects of the present invention. In other embodiments of the present invention, high quality decompression unit 810 may be included within a different type of data processor. A fragment shader 855 receives fragment data, including parameters associated with fragments (texture identifiers, texture coordinates, and the like). The texture identifiers may specify the compression scheme and whether or not the compressed data is signed or unsigned. Fragment shader 855 generates read requests for texture data that may stored as compressed data represented the medium quality compression format.

In some embodiments of the present invention, fragment shader 855 may include one or more cache memories configured to store texture data. A first cache memory may store compressed texture data and a second cache memory may store decompressed texture data. A first high quality decompression unit 810 receives the compressed texture data and decompresses it to produce texture data including one or more channels. A texture mapping unit 820 receives the texture data directly from high quality decompression unit 810 or indirectly from cache memory and processes the fragment data using the texture data to produce textured fragment data. Other processing units (not shown) may process the texture fragment data using techniques known to those skilled in the art to produce shaded fragments.

A raster operations unit 865 receives the shaded fragments from fragment shader 855 and processes the shaded fragments to produce pixel data for output to a frame buffer. Raster operations unit 865 includes a read interface (not shown) configured to output read requests to read frame buffer data stored in memory. A processing unit 835 optionally performs near and far plane clipping and raster operations, such as stencil, z test, blending, and the like, using the shaded fragments and pixel data stored at a pixel position (image location specified by x,y coordinates) associated with a shaded fragment. A second medium quality decompression unit 810 receives the frame buffer data, including compressed pixel data and decompresses the compressed pixel data to produce pixel data including one or more channels.

In some embodiments of the present invention, Raster operations unit 865 may include one or more cache memories configured to store frame buffer data. A first cache memory may store compressed pixel data and a second cache memory may store decompressed pixel data. Processing unit 835 receives the pixel data directly from the second high quality decompression unit 810 or indirectly from a cache memory and processes the shaded fragment data using the pixel data to produce frame buffer data. Processing unit 835 optionally outputs the frame buffer data to a high quality compression unit 840. High quality compression unit 840 optionally compresses the frame buffer data 840 into the high quality compression format and generates write requests to store the frame buffer data (compressed or uncompressed) in memory. As previously mentioned, high quality compression unit 840 may be configured to only compress pixel values when the block is filled, i.e., all sixteen pixels are populated. When the block is not filled, in those embodiments, the uncompressed 16 bit pixel values are output by high quality compression unit 840.

Figure 9:
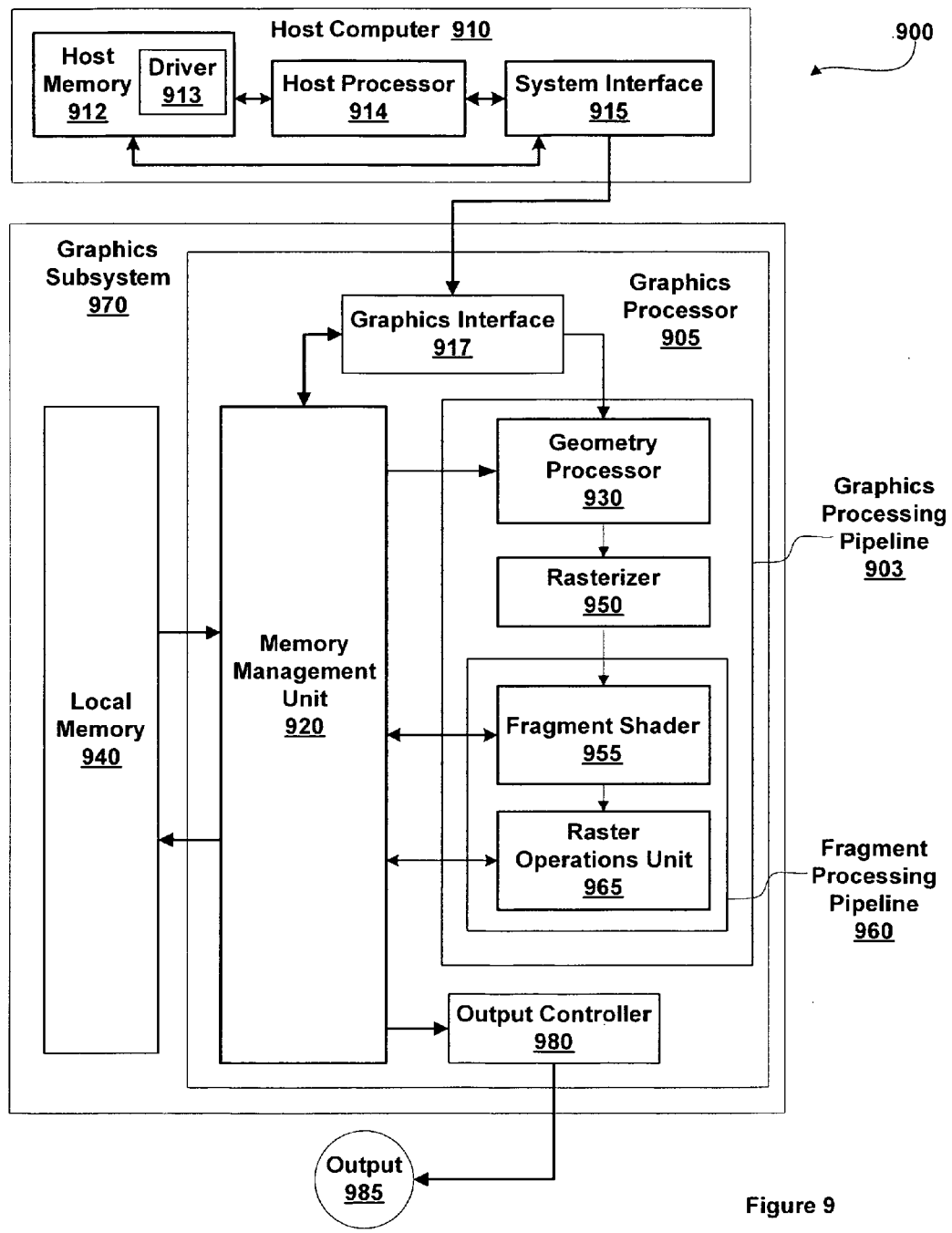
FIG. 9 is a block diagram of a graphics processing system in accordance with one or more aspects of the present invention.

FIG. 9 is a block diagram of an exemplary embodiment of a respective computer system, generally designated 900, and including a host computer 910 and a graphics subsystem 907 in accordance with one or more aspects of the present invention. Computing system 900 may be a desktop computer, server, laptop computer, palm-sized computer, tablet computer, game console, portable wireless terminal such as a PDA or cellular telephone, computer based simulator, or the like. Host computer 910 includes host processor 914 that may include a system memory controller to interface directly to host memory 912 or may communicate with host memory 912 through a system interface 915. System interface 915 may be an I/O (input/output) interface or a bridge device including the system memory controller to interface directly to host memory 912. An example of system interface 915 known in the art includes Intel® Northbridge.

A graphics device driver, driver 913, interfaces between processes executed by host processor 914, such as application programs, and a programmable graphics processor 905, translating program instructions as needed for execution by programmable graphics processor 905. Driver 913 also uses commands to configure sub-units within programmable graphics processor 905. Specifically, driver 913 may specify the compression scheme used to compress the data, e.g., medium quality or high quality, and whether or not compressed data is signed or unsigned.

Graphics subsystem 907 includes a local memory 940 and programmable graphics processor 905. Host computer 910 communicates with graphics subsystem 970 via system interface 915 and a graphics interface 917 within programmable graphics processor 905. Data, program instructions, and commands received at graphics interface 917 can be passed to a graphics processing pipeline 903 or written to a local memory 940 through memory management unit 920. Programmable graphics processor 905 uses memory to store graphics data, including texture maps, and program instructions, where graphics data is any data that is input to or output from computation units within programmable graphics processor 905. Graphics memory is any memory used to store graphics data or program instructions to be executed by programmable graphics processor 905. Graphics memory can include portions of host memory 912, local memory 940 directly coupled to programmable graphics processor 905, storage resources coupled to the computation units within programmable graphics processor 905, and the like. Storage resources can include register files, caches, FIFOs (first in first out memories), and the like.

In addition to Interface 917, programmable graphics processor 905 includes a graphics processing pipeline 903, a memory controller 920 and an output controller 980. Data and program instructions received at interface 917 can be passed to a geometry processor 930 within graphics processing pipeline 903 or written to local memory 940 through memory controller 920. In addition to communicating with local memory 940, and interface 917, memory controller 920 also communicates with graphics processing pipeline 903 and output controller 980 through read and write interfaces in graphics processing pipeline 903 and a read interface in output controller 980.

Within graphics processing pipeline 903, geometry processor 930 and a programmable graphics fragment processing pipeline, fragment processing pipeline 960, perform a variety of computational functions. Some of these functions are table lookup, scalar and vector addition, multiplication, division, coordinate-system mapping, calculation of vector normals, tessellation, calculation of derivatives, interpolation, filtering, and the like. Geometry processor 930 and fragment processing pipeline 960 are optionally configured such that data processing operations are performed in multiple passes through graphics processing pipeline 903 or in multiple passes through fragment processing pipeline 960. Each pass through programmable graphics processor 905, graphics processing pipeline 903 or fragment processing pipeline 960 concludes with optional processing by a raster operations unit 965.

Vertex programs are sequences of vertex program instructions compiled by host processor 914 for execution within geometry processor 930 and rasterizer 950. Shader programs are sequences of shader program instructions compiled by host processor 914 for execution within fragment processing pipeline 960. Geometry processor 930 receives a stream of program instructions (vertex program instructions and shader program instructions) and data from interface 917 or memory controller 920, and performs vector floating-point operations or other processing operations using the data. The program instructions configure subunits within geometry processor 930, rasterizer 950 and fragment processing pipeline 960. The program instructions and data are stored in graphics memory, e.g., portions of host memory 912, local memory 940, or storage resources within programmable graphics processor 905. When a portion of host memory 912 is used to store program instructions and data the portion of host memory 912 can be uncached so as to increase performance of access by programmable graphics processor 905. Alternatively, configuration information is written to registers within geometry processor 930, rasterizer 950 and fragment processing pipeline 960 using program instructions, encoded with the data, or the like.

Data processed by geometry processor 930 and program instructions are passed from geometry processor 930 to a rasterizer 950. Rasterizer 950 is a sampling unit that processes primitives and generates sub-primitive data, such as fragment data, including parameters associated with fragments (texture identifiers, texture coordinates, and the like). Rasterizer 950 converts the primitives into sub-primitive data by performing scan conversion on the data processed by geometry processor 930. Rasterizer 950 outputs fragment data and shader program instructions to fragment processing pipeline 960.

The shader programs configure the fragment processing pipeline 960 to process fragment data by specifying computations and computation precision. Fragment shader 955 is optionally configured by shader program instructions such that fragment data processing operations are performed in multiple passes within fragment shader 955. Fragment shader 955 may perform the functions of previously described fragment shader 355 or fragment shader 855, specifically fragment shader 955 may include one or more decompression units and/or compression units. Texture map data may be applied to the fragment data using techniques known to those skilled in the art to produce shaded fragment data.

Fragment shader 955 outputs the shaded fragment data, e.g., color and depth, and codewords generated from shader program instructions to raster operations unit 965. Raster operations unit 965 includes a read interface and a write interface to memory controller 920 through which raster operations unit 965 accesses data stored in local memory 940 or host memory 912. Raster operations unit 965 may perform the functions of previously described raster operations unit 865. Raster operations unit 965 optionally performs near and far plane clipping and raster operations, such as stencil, z test, blending, and the like, using the fragment data and pixel data stored in local memory 940 or host memory 912 at a pixel position (image location specified by x,y coordinates) associated with the processed fragment data. The output data from raster operations unit 965 is written back to local memory 940 or host memory 912 at the pixel position associated with the output data and the results, e.g., image data are saved in graphics memory.

When processing is completed, an output 985 of graphics subsystem 907 is provided using output controller 980. Alternatively, host processor 914 reads the image stored in local memory 940 through memory controller 920, interface 917 and system interface 915. Output controller 980 is optionally configured by opcodes to deliver data to a display device, network, electronic control system, other computing system 900, other graphics subsystem 907, or the like.

While the foregoing is directed to embodiments of the present invention, other and further embodiments of the invention may be devised without departing from the basic scope thereof, and the scope thereof is determined by the claims that follow. The foregoing description and drawings are, accordingly, to be regarded in an illustrative rather than a restrictive sense. The listing of steps in method claims do not imply performing the steps in any particular order, unless explicitly stated in the claim.

All trademarks are the respective property of their owners.

The invention claimed is:

1. A computer-implemented method of decompressing 16 bit values represented in a compressed format stored in a memory, comprising:
    extracting control information from the compressed format;
    extracting quantized predictor values from the compressed format based on the control information;
    extracting a plurality of quantized error values from the compressed format, each quantized error value corresponding to a single uncompressed 16 bit value;
    unquantizing the quantized predictor values and the plurality of quantized error values to produce predictor values and error values; and
    reverse transforming the predictor values and error values within a processor to produce the 16 bit values.

2. The method of claim 1, wherein the 16 bit values are represented in a fixed point data format.

3. The method of claim 2, wherein the fixed point data format includes a sign.

4. The method of claim 1, wherein the 16 bit values are represented in a floating point data format.

5. The method of claim 1, further comprising the step of decoding the control information to determine a number of bits used for at least one of the predictor values in the compressed format.

6. The method of claim 1, further comprising the step of decoding the control information to determine a number of bits used for at least one of the error values in the compressed format.

7. The method of claim 1, wherein the error values correspond to twelve of the 16 bit values.

8. The method of claim 1, wherein the 16 bit values correspond to a two-dimensional block of pixels.

9. The method of claim 1, wherein the quantized predictor values and the quantized error values are negative or nonnegative values.

10. A system for decompressing 16 bit data represented in a compressed format stored in a memory, comprising:
    an extraction unit configured to extract quantized predictor values and quantized error values from the compressed format;
    an unquantization unit configured to unquantize the quantized predictor values and quantized error values to produce predictor values and error values; and
    a reverse transformation unit configured to compute one or more 16 bit values using the predictor values and error values,
    wherein the extraction unit, the unquantization unit, and the reverse transformation unit are included in a processor.

11. The system of claim 10, wherein one of the one or more 16 bit values is represented in a fixed point data format.

12. The system of claim 11, wherein the fixed point data format includes a sign.

13. The system of claim 10, wherein one of the one or more 16 bit values is represented in a floating point data format.

14. The system of claim 10, further comprising a host processor configured to compress the 16 bit data into the compressed format and store the 16 bit data represented in the compressed format in a memory.

15. The system of claim 10, wherein the error values correspond to twelve of the 16 bit values.

16. The system of claim 10, wherein one the predictor values is a mean of the 16 bit values.

17. The system of claim 10, wherein the 16 bit data represented in the compressed format corresponds to a two-dimensional block of sixteen pixels.

18. The system of claim 10, wherein each of the quantized predictor values and each of the quantized error values include a sign bit.

19. A compressed data format embodied in a non-transitory computer-readable medium the compressed data format comprising:
    control information in a first field, wherein the control information indicates a configuration of the compressed data format;
    a first predictor value in a second field, wherein the first predictor represents a mean of sixteen 16 bit values represented by the compressed data format;
    a second predictor value in a third field;
    a third predictor value in a fourth field;
    a fourth predictor value in a fifth field; and
    twelve error values in twelve additional fields that correspond to twelve of the sixteen 16 bit values.

20. The compressed data format of claim 19, wherein the 16 bit values are represented in a floating point data format.

21. The compressed data format of claim 19, wherein the control information indicates a maximum number of bits needed to represent the first predictor value.

22. The compressed data format of claim 19, wherein the control information indicates a maximum number of bits needed to represent the second predictor value, the third predictor value, and the fourth predictor value.

* * * * *